United States Patent [19]
Yagi et al.

[11] 4,032,958
[45] June 28, 1977

[54] SEMICONDUCTOR DEVICE

[75] Inventors: Hajime Yagi, Tokyo; Tadaharu Tsuyuki, Isehara, both of Japan

[73] Assignee: Sony Corporation, Tokyo, Japan

[22] Filed: Oct. 15, 1975

[21] Appl. No.: 622,527

Related U.S. Application Data

[63] Continuation of Ser. No. 459,913, April 11, 1974, abandoned, which is a continuation-in-part of Ser. No. 427,647, Dec. 26, 1973, abandoned.

[30] Foreign Application Priority Data

Dec. 29, 1972 Japan .................................. 48-551
Apr. 18, 1973 Japan .............................. 48-43881

[52] U.S. Cl. .................................. 357/37; 357/34; 357/39; 357/40; 357/88; 357/89; 357/90
[51] Int. Cl.² ............... H01L 29/00; H01L 29/747; H01L 27/02; H01L 29/72
[58] Field of Search ............... 357/34, 37, 39, 88, 357/89, 90, 40

[56] References Cited

UNITED STATES PATENTS 2,822,310  2/1958  Stieltjes et al. ................... 357/34
3,696,273  10/1972  Foster ................................ 357/34

FOREIGN PATENTS OR APPLICATIONS 906,036  9/1962  United Kingdom ............... 357/34

Primary Examiner—Edward J. Wojciechowicz
Attorney, Agent, or Firm—Hill, Gross, Simpson, Van Santen, Steadman, Chiara & Simpson

[57] ABSTRACT

An NPN-type bipolar transistor is disclosed which has an additional P-type conductivity in its emitter region. The current-amplification factor $h_{FE}$ of the transistor is high when the additional region is electrically floated, while the amplification factor $h_{FE}$ is lower when the additional region is supplied with an emitter potential. The device is so designed and constructed that the transistor factor $h_{FE}$ can be variably controlled over a wide range. The transistor operates as an $h_{FE}$ controlled transistor. A thyristor is also disclosed which includes a cathode, a gate, and an electrically floated base electrode and which has an additional region formed in the cathode. This additional region is used as a second gate in addition to an ordinary gate, and either of the gates may be used for ON- and OFF- operations.

5 Claims, 5 Drawing Figures

SEMICONDUCTOR DEVICE

CROSS REFERENCE TO RELATED APPLICATION

This is a continuation of application Ser. No. 459,913, filed Apr. 11, 1974, now abandoned, which is a continuation-in-part application of our co-pending application, U.S. Ser. No. 427,647, filed December 26, 1973, now abandoned to the same assignee as the present invention, and entitled "Semiconductor Device".

BACKGROUND OF THE INVENTION

1. Field of the Invention

The present invention relates generally to a semiconductor device and more particularly to a transistor in which the diffusion length of minority carriers in its emitter region is large as compared with a prior art transistor.

In our co-pending U.S. patent application, Ser. No. 427,647, filed Dec. 26, 1973, assigned to the same assignee as the present invention, there is disclosed a transistor having a region of opposite conductivity in the emitter region to that of the emitter region. The impurity concentration in the emitter region is low, hence the diffusion length of minority carriers injected from the base region to the emitter region is long as compared with the thickness of the emitter region, and the life time of the minority carriers in the emitter region is kept long. In this earlier case, some of the current components flowing through the emitter junction or the current component injected from the base region to the emitter region is decreased and, consequently, the emission efficiency from the emitter region can be enhanced.

SUMMARY OF THE INVENTION

With a semiconductor device according to the present invention, for example, a transistor, the diffusion length of minority carriers in its emitter region is longer than the thickness of the emitter region, and an additional region is formed in the emitter region. In this case, the conductivity of the additional region is opposite to that of the emitter region.

With such a semiconductor device, when the additional region if floated electrically from the emitter region, the factor $h_{FE}$ of the transistor is high, but when the additional region is supplied with the emitter potential, the factor $h_{FE}$ is greatly lowered.

Accordingly, it is a main object of the present invention to provide a semiconductor device or a transistor the factor $h_{FE}$ of which can be variably controlled over a wide range.

It is another object of the invention to provide a semiconductor device which is suitable to be formed as a complementary integrated circuit and in which the impurity diffusion in an additional region of one transistor can be achieved by the same diffusion process as that of diffusion for the emitter region of the other transistor.

It is a further object of the invention to provide a thyristor which consists of the above mentioned controlled transistor formed of cathode, gate and electrically floated base electrodes, and in which an additional region formed in the cathode is used as a second gate in addition to an ordinary gate (which will be hereinafter referred to as a first gate) and any of the first and second gates is used for ON- and OFF- operations.

It is a further object of the invention to provide a semiconductor device in which the impurity concentration is lowered to keep the perfection of crystal and to reduce a noise.

It is a further object of the invention to provide a semiconductor device with high break-down voltage by lowering the impurity concentration in the vicinity of its PN-junction.

It is a yet further object of the invention to provide a semiconductor device superior in temperature characteristics.

The additional and other objects, features and advantages of the present invention will be easily understood by the following description taken in conjunction with the accompanying drawings.

DESCRIPTION OF THE PREFERRED EMBODIMENT

Figure 1:
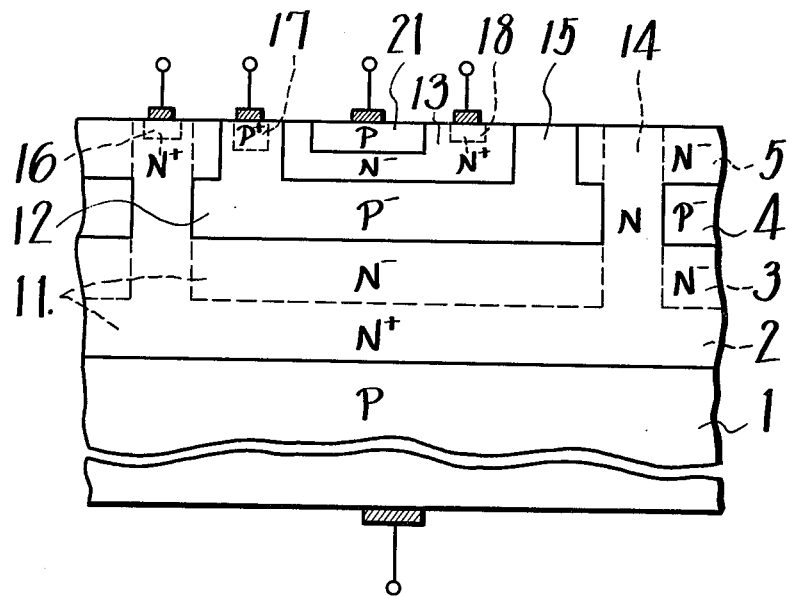
FIGS. 1 and 4 are enlarged cross-sectional views of an embodiment of the semiconductor device according to the present invention.

Before describing the present invention, the operation of an ordinary transistor will be described.

In general, the current-amplification factor of a transistor of the base-grounded type which is used as one of the parameters for evaluating the transistor is expressed by the following expression (1)

$$\alpha = \alpha^* \beta \gamma \qquad (1)$$

where $\alpha^*$ represents the collector amplification factor, $\beta$ the base transport factor and $\gamma$ the emitter efficiency.

Now, the efficiency $\gamma$ of an NPN-type transistor will first be considered. If the current density due to electrons injected from the emitter region to the base region of the transistor is taken as $J_n$, and the current density due to holes injected from the base region to the emitter region of the transistor is taken as $J_p$, respectively, the factor $\gamma$ can be expressed as follows:

$$\gamma = \frac{J_n}{J_n + J_p} = \frac{1}{1 + J_p/J_n} \qquad (2)$$

If $L_n$ is taken as the diffusion length of minority carriers in the base region; $L_p$ the diffusion length of the minority carriers in the emitter region; $D_n$ the diffusion constant of the minority carriers the base region; $D_p$ the diffusion constant of the minority carriers in the emitter region; $N_p$ the concentration of the minority carriers in the base region in equilibrium state; $P_n$ the concentration of the minority carriers in the emitter region in equilibrium state; and V the voltage applied to the emitter junction, the following expressions (3) and (4) are obtained:

$$J_n = \frac{qD_n n_p}{L_n} \left\{ \exp\left(\frac{qV}{kT}\right) - 1 \right\} \qquad (3)$$

-continued $$J_p = \frac{qD_p P_n}{L_p}\left(\exp\left(\frac{qV}{kT}\right) - 1\right) \quad (4)$$

Accordingly, the following expression (5) can be derived:

$$\delta = \frac{J_p}{J_n} = \frac{L_n}{L_p} \cdot \frac{D_p}{D_n} \cdot \frac{P_n}{n_p} \quad (5)$$

If the impurity concentration of the emitter and the base regions are taken as ND and NA, respectively, Pn/Np can be replaced by NA/ND, and Ln is limited by the base width W.

$$\delta = \frac{W}{L_p} \cdot \frac{D_p}{D_n} \cdot \frac{NA}{ND} \quad (6)$$

The diffusion constant is a function of the mobility of carriers and temperature and hence considered approximately constant.

As may be apparent from the above expressions, in order to increase the factor $\alpha$, it is desired that the term $\delta$ is small. In an ordinary transistor, this purpose is attained by selecting the term ND in the expression (6) very large. To this end, double diffusion technique for the base and emitter regions is employed. However, when the impurity concentration of the emitter region is selected very high, the state of crystallization is deteriorated in the emitter region and emitter junction. That is, if $\tau_p$ is taken as the life time of the minority carrier in the emitter region, the diffusion length $L_p$ is expressed as follows:

$$L_p = \sqrt{D_p \tau_p} \quad (7)$$

The life time $\tau_p$ is lowered in the case that the impurity concentration is high, the state of crystallization is bad, or there exist killers. For this reason, even if ND is selected to be great to a certain extent, due to greatly lowering of $L_p$, the lowering of $\delta$ in the expression (6) can not be taken full advantage of According to the present invention, the term $\delta$ is lowered in a manner different from the prior application to make the upper limit of the factor $\alpha$ high. That is, according to the present invention, by increasing the term $L_p$ in the expression (6) greatly, the term $\delta$ is reduced, which is one of the features of the invention. By way of example, ND is selected approximately 5 × 10$^{15}$ atoms/cm$^3$ and the term $L_p$ is selected to be about 300 microns by making the crystallization state good to cause the diffusion length of holes to be much greater than that of the ordinary transistor.

However, even if the diffusion length of the minority carrier (i.e., the hole) in the emitter region is long, another problem is present. That is, even if $L_p$ becomes greater than the thickness of the emitter region, the injected holes may be recombined on the surface of the emitter region, then disappear, and hence the diffusion length is limited by the thickness of the emitter region. In the ordinary transistor, however, $L_p$ is less than the thickness of the emitter region. Therefore, another feature of the present invention is the provision of means for making long the life time of minority carrier in the emitter region. By the means herein described, the value of $L_p$ which is determined by the impurity concentration in the emitter region is prevented from being lowered by the recombination on the surface of the emitter region.

An example of semiconductor device or an NPN-type transistor formed in an integrated circuit, by way of example, of the present invention will be now described. In the example of FIG. 1, reference numeral 1 indicates a P-type semiconductor substrate. On the P-type substrate 1 there are sequentially formed an N$^+$-type epitaxial layer 2, an N$^-$-type epitaxial layer 3, a P$^-$ type epitaxial layer 4 and an N$^-$-type epitaxial layer 5. In this case, the epitaxial layers 2 and 3 serve as a collector region 11, the epitaxial layer 4 serves as a base region, and the epitaxial layer 5 serves as an emitter region, respectively. Further, an N$^+$-type layer 16, a P$^+$-type layer 17 and an N$^+$-type layer 18 are formed in the regions 11, 12 and 13 for deriving collector, base and emitter electrodes, respectively. In this example, the impurity concentration of the epitaxial layers 4 and 5 is selected about 10$^{15}$ to 10$^{16}$ atoms/cm$^3$. In the emitter region 13, there is further provided an additional injection region 21 by diffusion of P-type impurity to the emitter region 13 to form a barrier by the formation of a PN-junction. The current-amplification factor $\alpha$ or $h_{FE}$ of the thus formed transistor is ascertained very high as compared with that of a transistor with no additional region 21. In FIG. 1, reference numeral 14 shows an isolation region of an N-type which is formed by diffusion for isolating the base region 12, and 15 an isolation region of a P-type which is formed by diffusion for isolating the emitter region 13.

The additional region 21 of P-type shown in FIG. 1 is one of the above means for holding the life time of the hole rather long. In this case, the expression (6) which may be for a one dimensional model should be corrected by terms including the shape and so on of the additional region 21. This correction may be difficult to be expressed, but this operation can be considered as follows. However, the present invention should not be limited thereto.

With the present invention, the holes injected from the base region to the emitter region may arrive at the barrier PN junction formed between the additional region 21 and the emitter region 13 without being attenuated due to its then large diffusion length and then collected into the additional region 21 of P-type. If the additional region 21 is floated from an electrical point of view, its potential increases by the increase of the holes, the PN junction is biased in forward direction to its rising voltage substantially and thereafter kept constant. As a result, the concentration of holes in the vicinity of the additional region 21 increases remarkably since holes are reinjected back into the emitter region 13. Consequently the concentration gradient of holes in the emitter region becomes much lower as compared with that of the prior art transistor. Since the diffusion current from the base region to the emitter region is in proportion to the concentration gradient of holes in the emitter region, the current density $J_p$ becomes very small. Thus, the electron current arriving at the collector region in the current components, which may pass through the emitter junction, is increased in rate, the emitter efficiency $\gamma$ obtained by the expression (2) becomes large in value, and the factor $\alpha$ becomes high.

In fact, with the present invention, the semiconductor device is used with its additional injection region 21 being supplied with a potential. When the additional region 21 is supplied with a positive potential in the forward direction relative to the emitter region, the life time of holes in the emitter region is kept long as in the case that the additional region is floated from electrical point of view. For example, when the additional region 21 is supplied with the base potential at a normal operating point, its factor $\alpha$ is high. On the contrary, when the additional region 21 is supplied with the potential same as that of the emitter or negative potential relative to the emitter potential, the additional region 21 will operate differently from that described as above. That is, the holes injected from the base region to the emitter region are collected in the additional region. For this reason, the hole concentration of the emitter region in the vicinity of the additional region is lowered greatly. The effective diffusion length of holes in the emitter region is limited by the thickness of the emitter region, so that the concentration gradient of holes therein is increased and the diffusion current from the base region to the emitter region is increased. As a result, the value of the emitter efficiency $\gamma$ is decreased and hence, the value of factor $\alpha$ is decreased.

Figure 2:
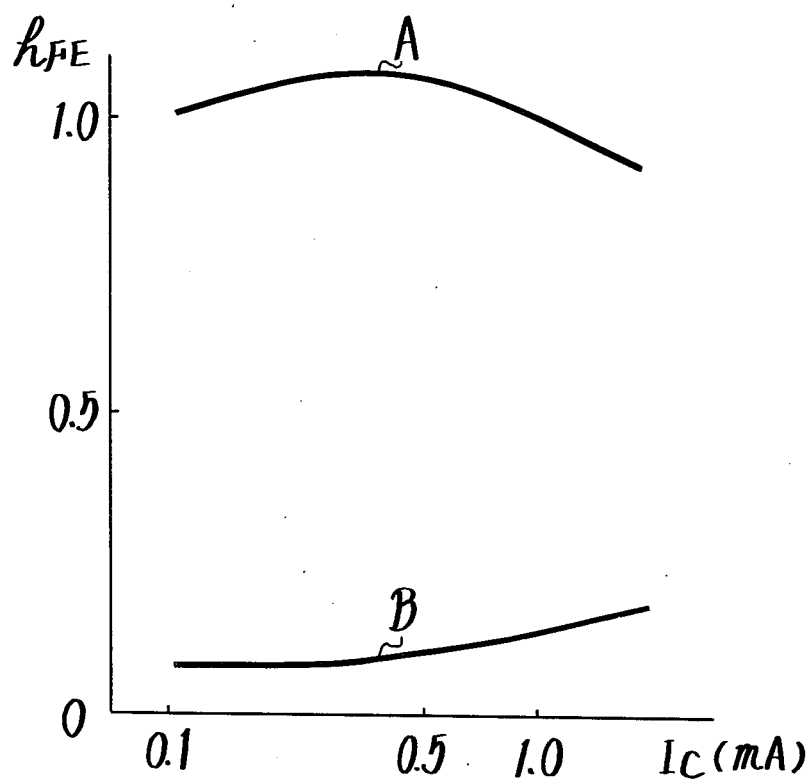
FIGS. 2 and 3 are graphs illustrating the characteristics of the semiconductor device depicted in FIG. 1.

The factor $h_{FE}$ (current-amplification factor of emittergrounded transistor), that is $\alpha/(1-\alpha)$ relative to the collector current $I_C$ is shown in FIG. 2 in which the abscissa represents the collector current $I_C$ in milliampere (mA) and the ordinate the current-amplfication factor $h_{FE}$ with the value of $h_{FE}$ corresponding to 0.1 mA of $I_C$ being as a standard. In FIG. 2, a curve B shows the $h_{FE}$ in the case that the additional region 21 is connected to the emitter region and a curve A shows the $h_{FE}$ in the case where the additional region 21 is floated electrically. It will be easily understood from FIG. 2 that the $h_{FE}$ of curve B is lower than that of A by about the first order.

Figure 3:
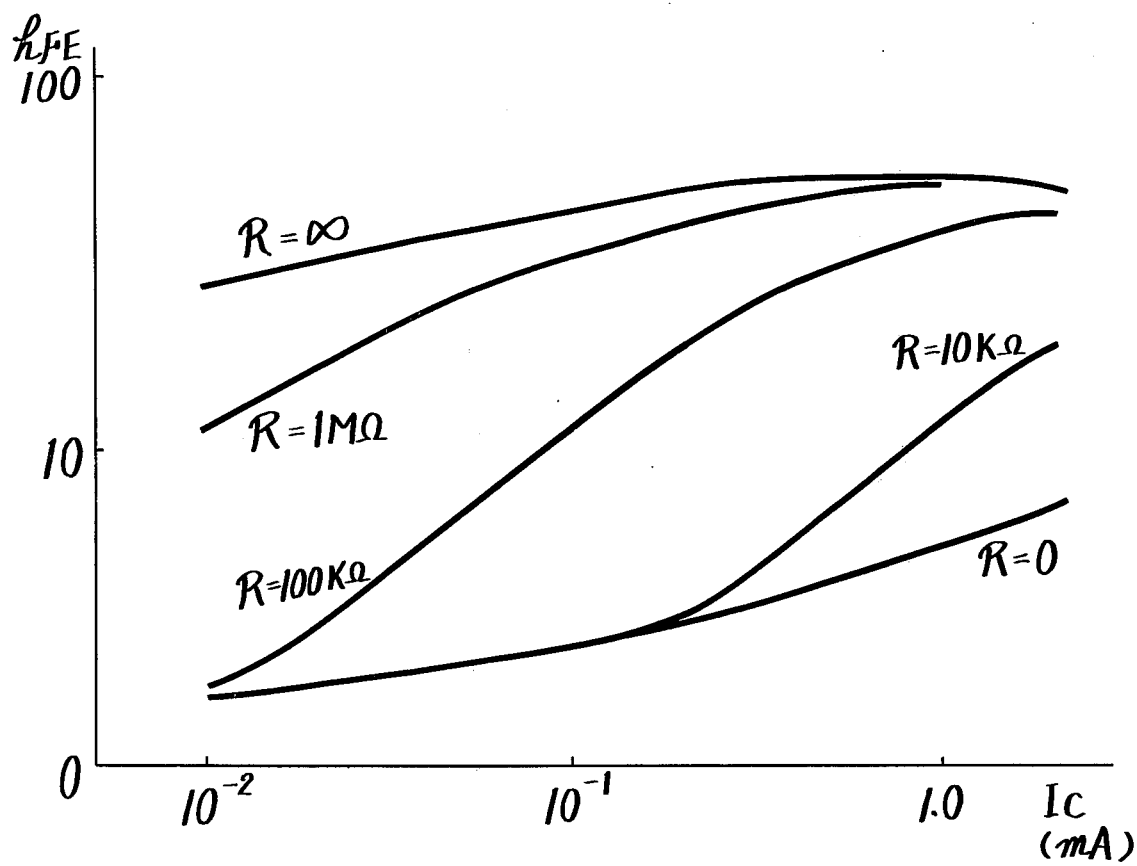

Between the points from the additional region 21 being at the same potential of the emitter region to that being biased forwardly, the factor $h_{FE}$ may be changed from a low value to a high value continuously. FIG. 3 is a graph which shows characteristics of the factor $h_{FE}$ (ordinate) versus $I_C$ (abscissa) with the resistance value R of a resistor (not shown) connected between the additional region 21 and the emitter region as a parameter where $V_{CE} = 3V$.

Figure 4:
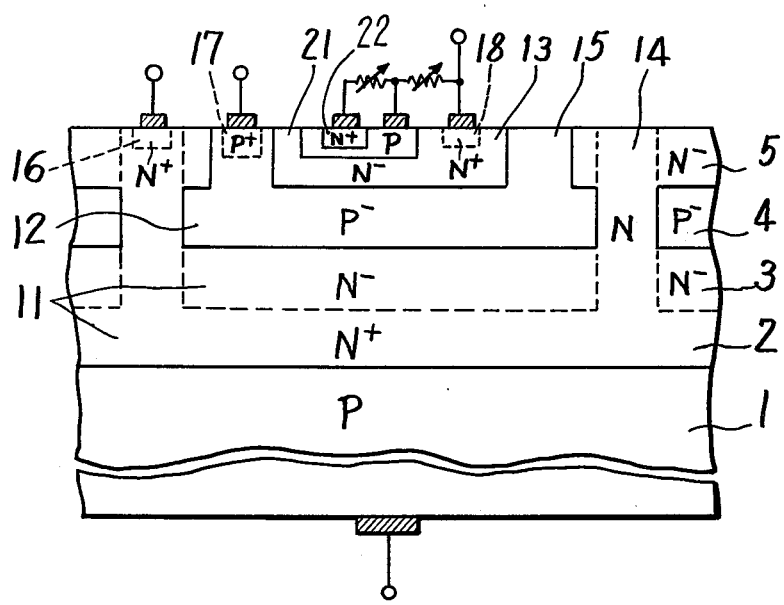

It is possible to have provided a second additional region 22 of N-type shown in FIG. 4 in the additional region 21 of P-type. If such two additional regions are connected and then floated electrically, characteristics between those shown by the curves A and B in FIG. 2 can be obtained. Further, if the second additional region is connected to the emitter region, its factor $h_{FE}$ is lowered as shown by the curve B in FIG. 2.

As may be apparent from the foregoing, if the transistor according to the invention is employed, a gain control circuit which is small in input impedance change can be obtained.

A thyristor can be formed by the employment of the transistor mentioned as above. In general, a thyristor of PNPN-type can be considered that it is formed of an NPN-type transistor which has cathode, gate and electrically floated base of the thyristor as its emitter, base and collector equivalently, and a PNP-type transistor which has anode, electrically floated base and gate of the thyristor as its emitter, base and collector, respectively. If the current-amplification factor $\alpha$ of the NPN-type transistor is assumed as $\alpha_1$ and that of the PNP-type transistor as $\alpha_2$, the thyristor permits the passage of main current therethrough when $\alpha_1 + \alpha_2 > 1$, but cuts off the passage of the main current when $\alpha_1 + \alpha_2 < 1$.

With the invention, the control transistor with the above additional region is used as the NPN-type transistor of the thyristor. That is, an additional region of P-type is formed in a cathode of N-type is used as a second gate, and a suitable voltage is applied across the second gate and cathode, so that the current-amplification $\alpha_1$ is controlled variably. Thus, irrespective of the ordinary (first) gate, the second gate can be used for the ON-OFF control of the main current of the tyristor. In this case, however, the first gate has current control operation, but the second gate has voltage control operation. Such a thyristor can be easily formed of the semiconductor device shown in FIG. 1 in which the P-type substrate 1 is used as an anode, the P$^-$-type region 12 is used as the first gate, the N$^-$-type region 13 is used as the cathode, and the P-type region 21 is used as the second gate.

Figure 5:
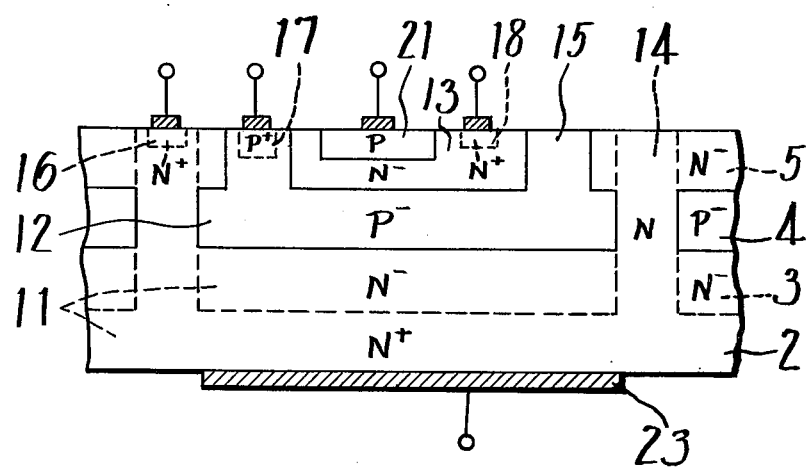
FIG. 5 is an enlarged cross-sectional view of an alternate embodiment of the device illustrated in FIGS. 1 and 4.

In this case, it is possible to have the anode formed as a Schottky barrier 23 of metal such as aluminum or the like in place of the P-type region as shown in FIG. 5. Reference numerals in FIG. 5 correspond to those in FIG. 1. Operation is similar to that described for the thyristor above. The thyristor of such a construction has an improved switching characteristic at OFF-state.

FIG. 4 is a fragmentary view similar to a portion of FIG. 1, but showing a fifth semiconductor region in the fourth semiconductor region, and showing a variable bias to the fourth semiconductor region to provide the control means for the device.

From the foregoing description, it will be noted that, a first semiconductor region of a first conductivity type, by way of example, may be deemed to be region 13, a second region of the second conductivity type may be deemed to be region 12, a third region of the first conductivity type may be deemed to be region 11, a fourth region of the second conductivity type may be deemed to be region 21, a fifth region (shown but not numbered) of the first conductivity type may be deemed to be a region located within region 21, and a sixth region of the second conductivity type may be deemed to be the substrate 1.

The foregoing description is given as the preferred embodiment only, but it will be apparent that the present invention need not be limited only to the illustrated example. For example, the present invention may be applied to many semiconductor devices such as a PNP-type transistor, and many modifications and variations may be effected without departing from the spirit and scope of the novel concepts of the invention.

We claim as our invention:
1. A semiconductor device comprising:
  a. a first semiconductor region of a first conductivity type;
  b. a second semiconductor region of a second conductivity type forming a first PN junction with said first region;
  c. a third semiconductor region of said first conductivity type forming a second PN junction with said second region which is spaced from said first junction by said second region;
  d. a fourth semiconductor region of said second conductivity type forming a third PN junction with said first region which is spaced from said first PN junction by said first region, the distance between said first and third junctions being smaller than the diffusion length of minority carriers in said first region;

e. means for applying an input signal between said first and second regions and transporting majority carriers in said first region to said third region; and f. control means connected at least to said fourth region for applying a bias voltage between said first and fourth regions whereby the ratio of current of said majority carriers to input current may be adjusted by changing said bias voltage.

2. The semiconductor device of claim 1, in which said control means comprises a resistive means connected between said first and fourth regions.

3. The semiconductor device of claim 1, in which a fifth semiconductor region of said first conductivity type forms a fourth PN junction with said fourth region which is spaced from said third semiconductor junction by said fourth region, and a second control means being applied between said fourth and fifth regions.

4. The semiconductor device of claim 1, in which a fifth semiconductor region of said second conductivity type forms a fourth PN junction spaced from said second PN junction by said third region, whereby a main current through said first, second, third and fifth regions can be controlled by said control voltage.

5. The semiconductor device of claim 1, in which a Schottky barrier metal is joined with said third region and spaced from said second PN junction by said third region, whereby a main current through said first, second and third regions and said barrier metal can be controlled by said control voltage.

* * * * *